United States Patent
Hsieh et al.

(10) Patent No.: US 7,358,540 B2
(45) Date of Patent: Apr. 15, 2008

(54) ORGANIC ADHESIVE LIGHT-EMITTING DEVICE WITH OHMIC METAL CONTACT

(75) Inventors: Min-Hsun Hsieh, Hsin-Chu (TW);
Ya-Lan Yang, Hsin-Chu (TW);
Ching-San Tao, Hsin-Chu (TW);
Tzu-Feng Tseng, Hsin-Chu (TW);
Jr-Peng Ni, Hsin-Chu (TW)

(73) Assignee: Epistar Corporation, Hsin-Chu (TW)

( * ) Notice: Subject to any disclaimer, the term of this patent is extended or adjusted under 35 U.S.C. 154(b) by 316 days.

(21) Appl. No.: 10/905,221

(22) Filed: Dec. 22, 2004

(65) Prior Publication Data
US 2005/0167659 A1 Aug. 4, 2005

(30) Foreign Application Priority Data
Jan. 16, 2004 (TW) .............................. 93101466 A (51) Int. Cl.
*H01L 33/00* (2006.01)

(52) U.S. Cl. .................... 257/98; 257/99; 257/E33.068

(58) Field of Classification Search .................. 257/79, 257/94, 95, 98, 99, E33.068, E33.056; 438/29, 438/47, 43, 48
See application file for complete search history.

(56) References Cited

U.S. PATENT DOCUMENTS

| | | | | |
|---|---|---|---|---|
| 7,015,513 B2 * | 3/2006 | Hsieh | ........................... | 257/99 |
| 2004/0106225 A1 | 6/2004 | Hsieh | | |
| 2004/0119084 A1 * | 6/2004 | Hsieh et al. | ................... | 257/98 |
| 2004/0178415 A1 * | 9/2004 | Hsu et al. | ...................... | 257/80 |

* cited by examiner

*Primary Examiner*—Matthew C. Landau
(74) *Attorney, Agent, or Firm*—Quintero Law Office (57) ABSTRACT

An organic adhesive light-emitting device with an ohmic metal contact, including a conductive substrate having a first surface and a second surface over the upper surface, a light-emitting stack layer, an ohmic metal bulge formed over the first surface of the conductive substrate, a reflection layer formed over the light-emitting stack layer, a first reaction layer formed over the ohmic metal bulge and the second surface of the conductive substrate, a second reaction layer formed over the reflection layer, and an organic adhesive material. The reaction layer can punch through the organic adhesive material for forming the ohmic contact with the first reaction layer bonded to the second reaction layer by the organic adhesive material, and with the ohmic metal bulge.

41 Claims, 6 Drawing Sheets

ORGANIC ADHESIVE LIGHT-EMITTING DEVICE WITH OHMIC METAL CONTACT

BACKGROUND OF INVENTION

1. Field of the Invention

The present invention provides a light-emitting diode, and more particularly, an organic adhesive light-emitting device with an ohmic metal contact.

The applications of light-emitting diodes are extensive and include optical display devices, traffic signals, data storing devices, communication devices, illumination devices, and medical apparatuses. As such, it is important to increase the brightness of light-emitting diodes, and to simplify manufacturing processes in order to decrease the cost of the light-emitting diode.

2. Description of the Prior Art

A light-emitting diode and its related manufacture method are disclosed in a U.S. patent application publication U.S. 2004/0106225, in which a light-emitting diode stack layer is bonded to a transparent substrate by means of an adhesive layer, which includes a first reaction layer and a second reaction layer in the upper and lower surfaces for preventing the adhesive layer from being stripped, thus preventing light emitted toward the transparent substrate from being absorbed and improving the brightness of the diode. Nevertheless, the prior art method, due to the non-conductivity of the transparent adhesive layer, while being suitable for use in diodes of which two electrodes are located at the same side, is not suitable for use in diodes of which electrodes are respectively located at the upper surface and lower surface of the diode. In addition, part of the diode stack layer needs to be removed by means of an etching process to produce two electrodes at the same side. In doing so, not only is material wasted, but also the complexity of the manufacturing process is increased.

SUMMARY OF INVENTION

It is therefore a primary objective of the claimed invention to provide a light-emitting diode for bonding a conductive substrate and a light-emitting stack layer together with an organic adhesive layer, and for forming an ohmic contact between the light-emitting stack layer and the conductive substrate with an ohmic metal bulge, so as to conduct current, and to simplify manufacturing processes and to reduce the cost of the diode.

Briefly described, the claimed invention discloses an organic adhesive light-emitting device with an ohmic metal contact. The organic adhesive light-emitting device comprises a conductive substrate, which includes a upper surface with a first region and a second region, a light-emitting stack layer, an ohmic metal bulge formed over the first region of the conductive substrate, a reflection layer formed over the light-emitting stack layer, a first reaction layer formed over the ohmic metal bulge and the second surface of the conductive substrate, a second reflection layer formed over the reflection layer, and an organic adhesive material for bonding the first reaction layer and the second reaction layer together. Parts or the whole of the first reaction layer are capable of punching through the organic adhesive material with the ohmic metal bulge for forming an ohmic contact with the second reaction layer. The organic adhesive material increases adhesion force with the first and the second reaction layers.

According to the claimed invention, the conductive substrate comprises at least one material selected from a material group consisting of GaP, GaAsP, AlGaAs, Si, Ge, and SiC, or other substitute materials. The adhesive material comprises at least one material selected from a material group consisting of PI, BCB, and PFCB, or other substitute materials. The ohmic metal bulge comprises at least one material selected from a material group consisting of In, Sn, Al, Au, Pt, Zn, Ge, Ag, Ti, Pb, Pd, Cu, AuBe, AuGe, Ni, PbSn, and AuZn, or other substitute materials. The reflection layer comprises at least one material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide, or other substitute materials. The first reaction layer comprises at least one material selected from a material group consisting of Ti and Cr, or other substitute materials. The second reaction layer comprises at least one material selected from a material group consisting of Ti and Cr, or other substitute materials. The light-emitting layer comprises at least one material selected from a material group consisting of AlGaInP, GaN, InGaN, and AlInGaN, or other substitute materials.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
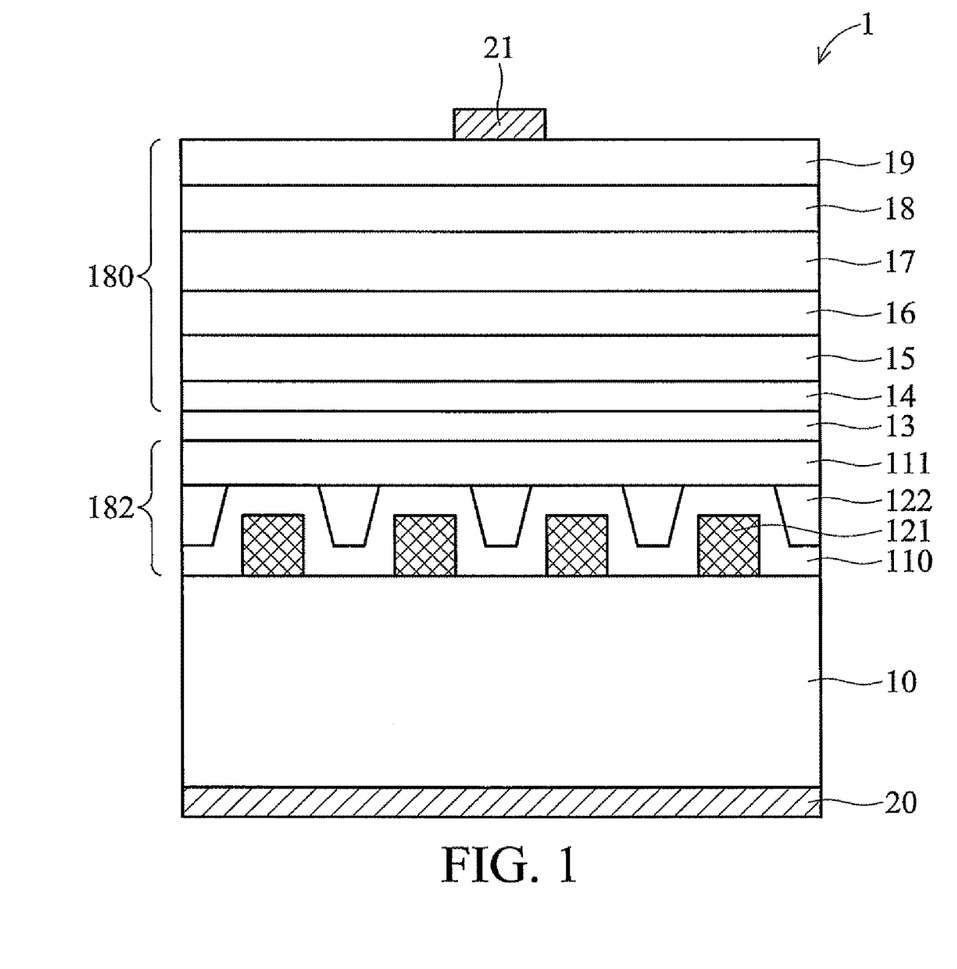
FIG. 1 illustrates a schematic diagram of a present invention light-emitting diode having an organic adhesive layer with an ohmic metal contact.

Please refer to FIG. 1, which illustrates an organic adhesive light-emitting device 1. The organic adhesive light-emitting device 1 includes a first electrode 20, a conductive substrate 10 formed over the first electrode 20 with a upper surface comprising a first region and a second region, an ohmic metal bulge 121 formed over the first region of the conductive substrate 10, a first reaction layer 110 formed over the second region of the conductive substrate 10 and the ohmic metal bulge 121, an organic adhesive material 122 formed over the first reaction layer 110, a second reaction layer 111 formed over the organic adhesive material 122; parts or the whole of the first reaction layer 110 are capable of punching through the organic adhesive material 122 with the ohmic metal bulge 121 for forming an ohmic contact with the second reaction layer 111. The organic adhesive light-emitting device 1 further includes a reflection layer 13 formed over the second reaction layer 111, a transparent conductive layer 14 formed over the reflection layer 13, a first contact layer 15 formed over the transparent conductive layer 14, a first cladding layer 16 formed over the first contact layer 15, a light-emitting layer 17 formed over the first cladding layer 16, a second cladding layer 18 formed over the light-emitting layer 17, a second contact layer 19 formed over the second cladding layer 18, and a second electrode 21 formed over the second contact layer 19. The first and the second reaction layers 110 and 111 increase adhesion force with the organic adhesive material 122. The ohmic metal bulge 121 can further be formed between the reflection layer 13 and the second reaction layer 111. Parts or the whole of the ohmic metal bulge 121 can punch through the first reaction layer 110 for forming an ohmic contact with the second reaction layer 111. The reflection layer 13 can be removed because its purpose is simply to increase brightness.

In FIG. 1, the transparent conductive layer 14, the first contact layer 15, the first cladding layer 16, the light-emitting layer 17, the second cladding layer 18 and the second contact layer 19 together can be referred to as a light-emitting stack layer 180. The ohmic metal bulge 121, the first reaction layer 110, the organic adhesive material 122 and the second reaction layer 111 can be referred to as a stack structure 182 positioned between the conductive substrate 10 and the light-emitting stack layer 180, providing electric connection between conductive substrate 10 and the light-emitting stack layer 180. The reflection layer 13 is optional as mentioned above. An ohmic contact can be formed between the conductive substrate 10 and the ohmic metal bulge 121. Similarly, an ohmic contact can be formed between the light-emitting stack layer 180 and the second reaction layer 111 if there is no reflection layer 13.

Figure 2:
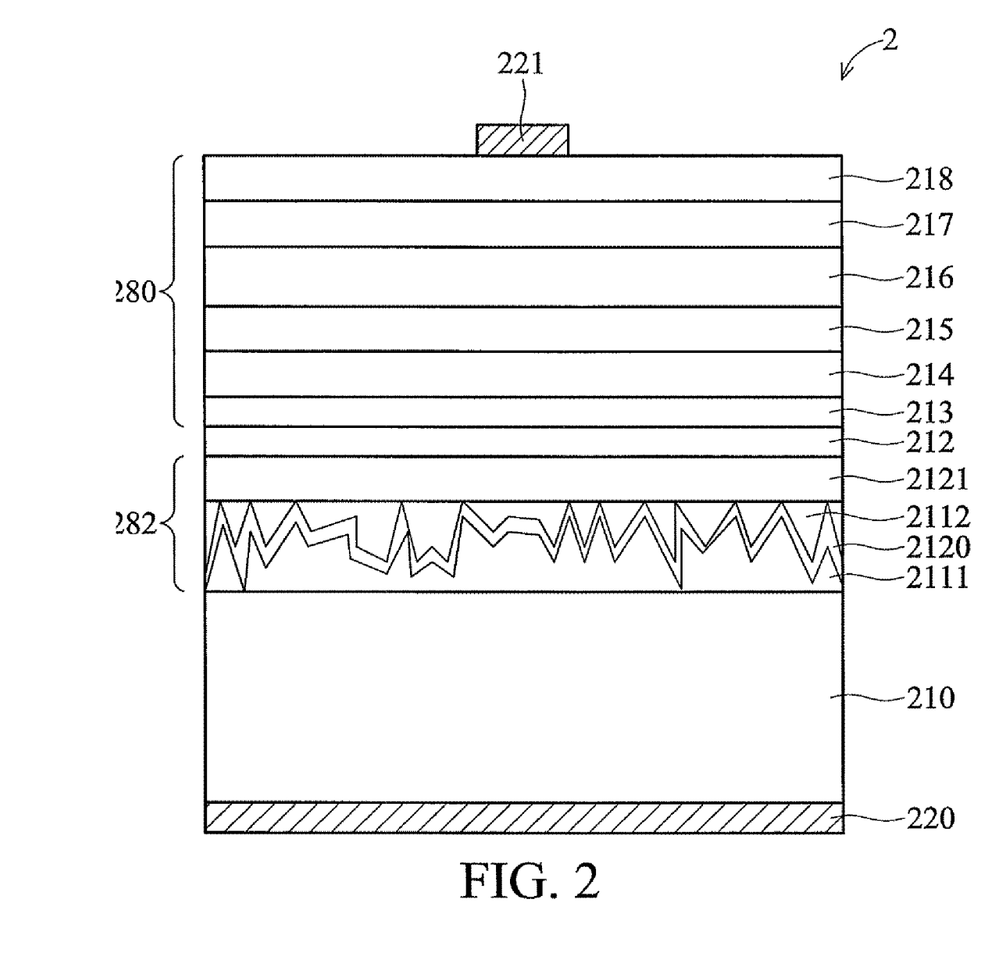
FIG. 2 illustrates a schematic diagram of a present invention light-emitting diode having an organic adhesive layer with an ohmic metal contact.

Please refer to FIG. 2, which illustrates an organic adhesive light-emitting device 2. The organic adhesive light-emitting device 2 includes a first electrode 220, a conductive substrate 210 formed over the first electrode 220, an ohmic metal layer 2111 formed over the conductive substrate 210. The ohmic metal layer 2111 includes a convex-concave surface, which can be formed with an etching waiting process while or after forming the ohmic metal layer 2111. The organic adhesive light-emitting device 2 further includes a first reaction layer 2120 formed over the convex-concave surface of the ohmic metal layer 2111, an organic adhesive material 2112 formed over the first reaction layer 2120, a second reaction layer 2121 formed over the organic adhesive material 2112; parts or the whole of the first reaction layer 2120 is capable of punching through the organic adhesive material 2112 with the convex part of the convex-concave surface of the ohmic metal layer 2111 for forming an ohmic contact with the second reaction layer 2121. In addition, the organic adhesive light-emitting device 2 includes a reflection layer 212 formed over the second reaction layer 2121, a transparent conductive layer 213 formed over the reflection layer 212, a first contact layer 214 formed over the transparent conductive layer 213, a first cladding layer 215 formed over the first contact layer 214, a light-emitting layer 216 formed over the first cladding layer 215, a second cladding layer 217 formed over the light-emitting layer 216, a second contact layer 218 formed over the second cladding layer 217, and a second electrode 221 formed over the second contact layer 218. The organic adhesive material 2112 adheres to a part of the reflection layer 212, while the ohmic metal layer 2111 forms an ohmic contact with another part of the reflection layer 212. The first and the second reaction layers 2120 and 2121 increase adhesion force with the organic adhesive material 2112. The ohmic metal layer 2111 can be formed between the reflection layer 212 and the second reaction layer 2121. The reflection layer 212 can be removed because its purpose is simply to increase brightness.

In FIG. 2, the transparent conductive layer 213, the first contact layer 214, the first cladding layer 215, the light-emitting layer 216, the second cladding layer 217 and the second contact layer 218 together can be referred to as a light-emitting stack layer 280. The ohmic metal layer 2111, the first reaction layer 2120, the organic adhesive material 2112 and the second reaction layer 2121 can be referred to as a stack structure 282 positioned between the conductive substrate 210 and the light-emitting stack layer 280, providing electric connection between conductive substrate 210 and the light-emitting stack layer 280. The reflection layer 212 is optional as mentioned above.

Figure 3:
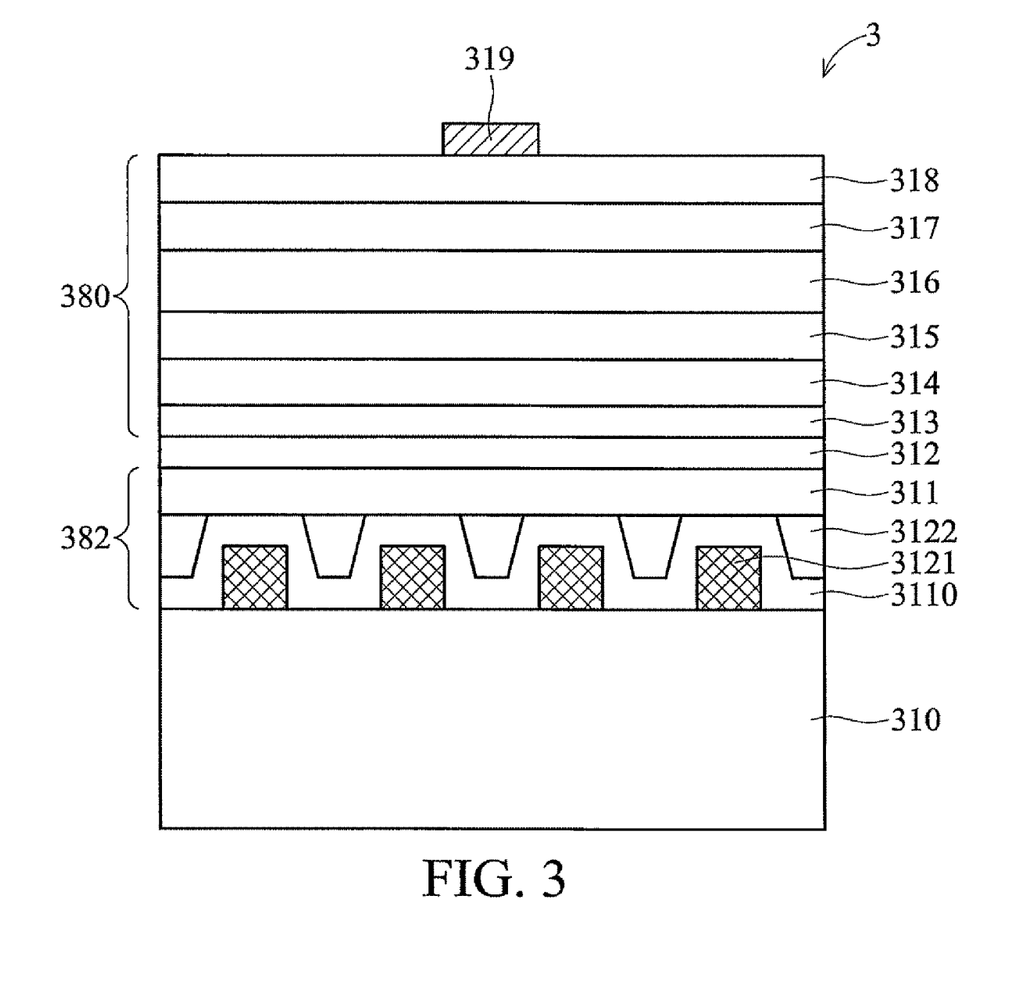
FIG. 3 illustrates a schematic diagram of a present invention light-emitting diode having an organic adhesive layer with an ohmic metal contact.

Please refer to FIG. 3, which illustrates an organic adhesive light-emitting device 3. The organic adhesive light-emitting device 3 includes a metal substrate 310 with a upper surface comprising a first region and a second region, an ohmic metal bulge 3121 formed over the first region of the metal substrate 310, a first reaction layer 3110 formed over the second surface of the metal substrate 310 and the ohmic metal bulge 3121, an organic adhesive material 3122 formed over the first reaction layer 3110, a second reaction layer 3111 formed over the organic adhesive material 3122; parts or the whole of the first reaction layer 3110 are capable of punching through the organic adhesive material 3122 with the ohmic metal bulge 3121 for forming an ohmic contact with the second reaction layer 3111. The organic adhesive light-emitting device 3 further includes a reflection layer 312 formed over the second reaction layer 3111, a transparent conductive layer 313 formed over the reflection layer 312, a first contact layer 314 formed over the transparent conductive layer 313, a first cladding layer 315 formed over the first contact layer 314, a light-emitting layer 316 formed over the first cladding layer 315, a second cladding layer 317 formed over the light-emitting layer 316, a second contact layer 318 formed over the second cladding layer 317, and an electrode 319 formed over the second contact layer 318. The first and the second reaction layers 3110 and 3111 increase adhesion force with the organic adhesive material 3122. The ohmic metal bulge 3121 can further be formed between the reflection layer 312 and the second reaction layer 3111. Parts or the whole of the ohmic metal bulge 3121 can punch through the first reaction layer 3110 for forming an ohmic contact with the second reaction layer 3111. The reflection layer 312 can be removed because its purpose is simply to increase brightness.

In FIG. 3, the transparent conductive layer 313, the first contact layer 314, the first cladding layer 315, the light-emitting layer 316, the second cladding layer 317 and the second contact layer 318 together can be referred to as a light-emitting stack layer 380. The ohmic metal bulge 3121, the first reaction layer 3110, the organic adhesive material 3122 and the second reaction layer 3111 can be referred to as a stack structure 382 positioned between the metal substrate 310 and the light-emitting stack layer 380, providing electric connection between the metal substrate 310 and the light-emitting stack layer 380. The reflection layer 312 is optional as mentioned above.

Figure 4:
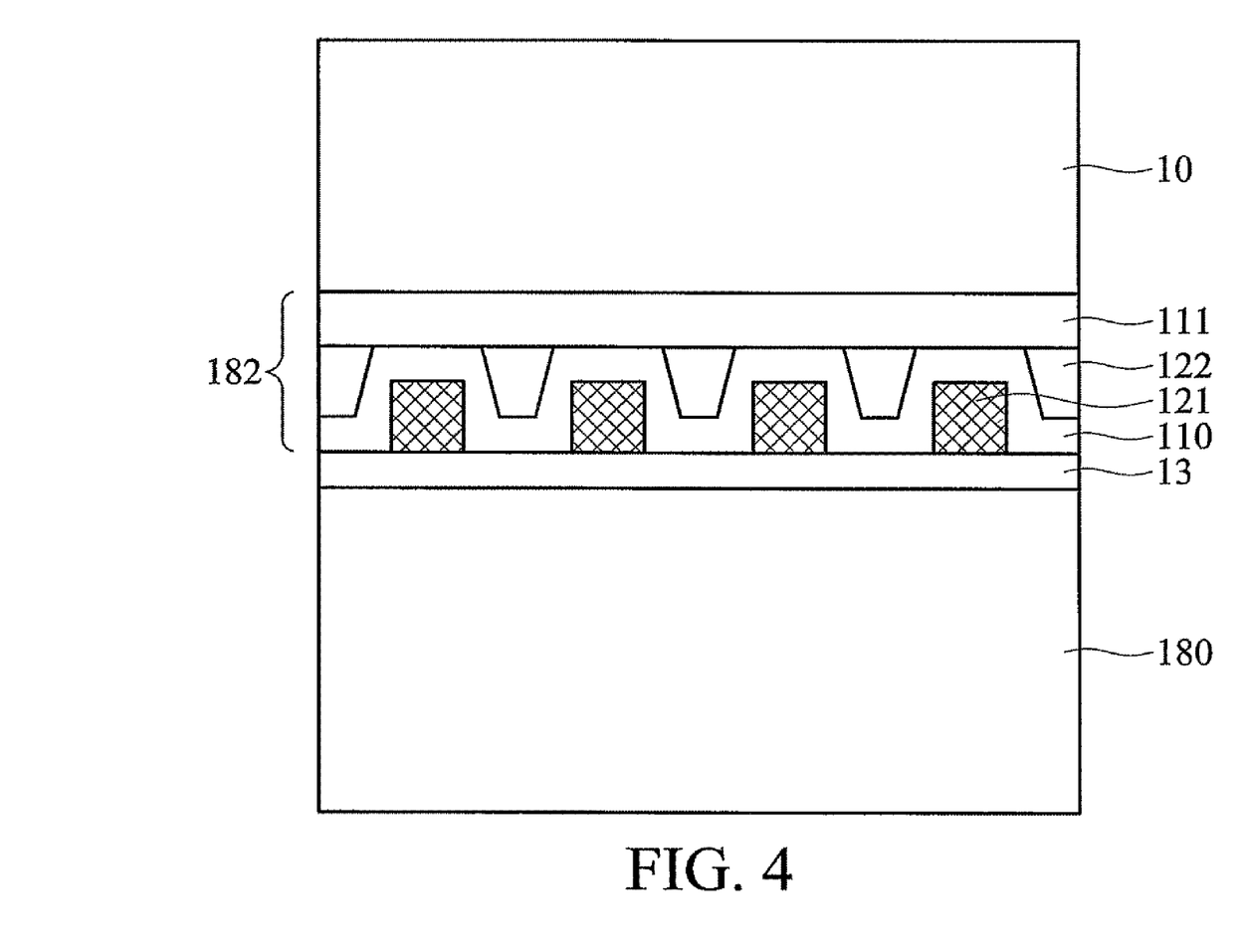
FIGS. 4-6 illustrate three schematic diagrams according to embodiments of the invention, corresponding to FIGS. 1-3.
Figure 5:
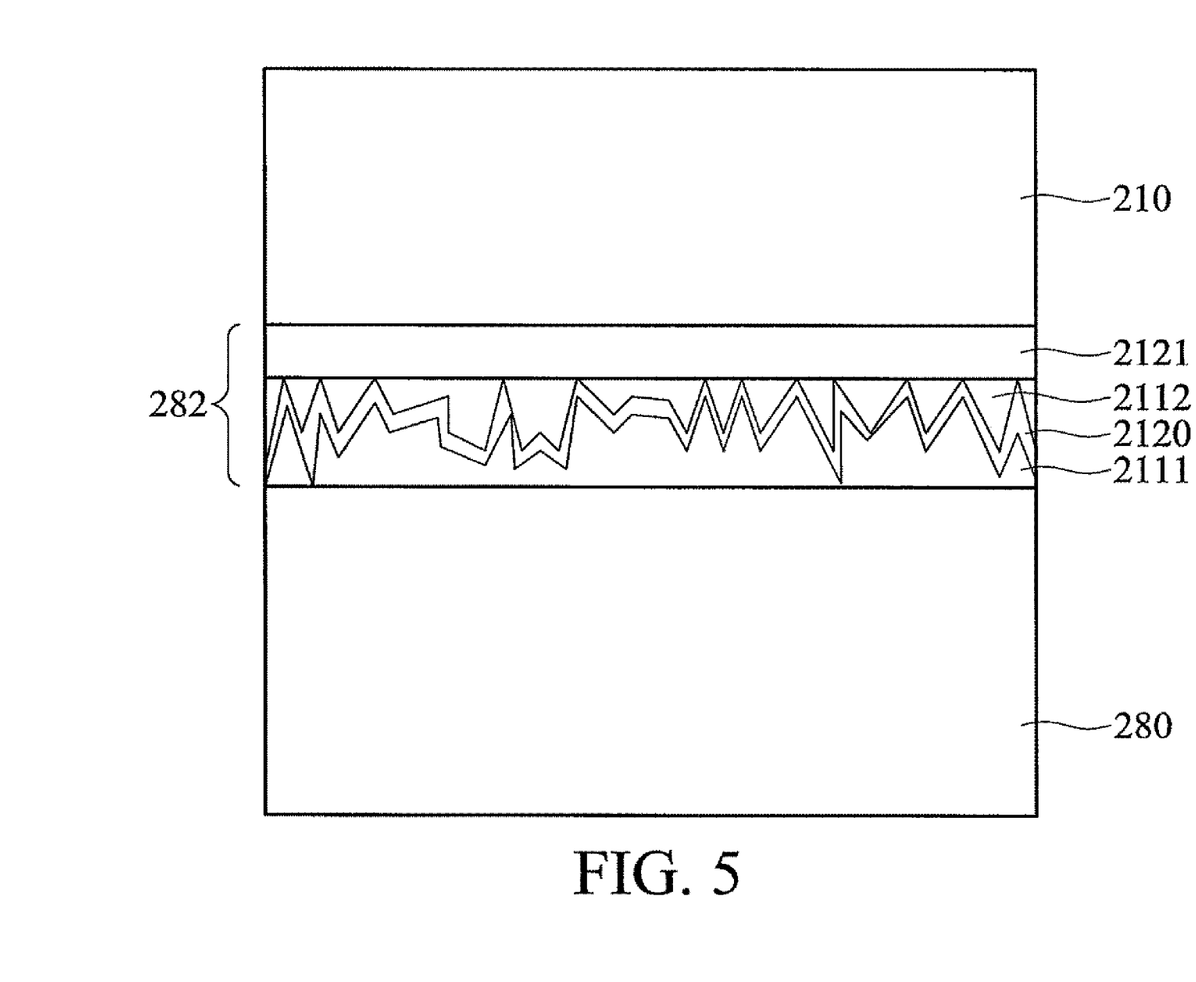
Figure 6:
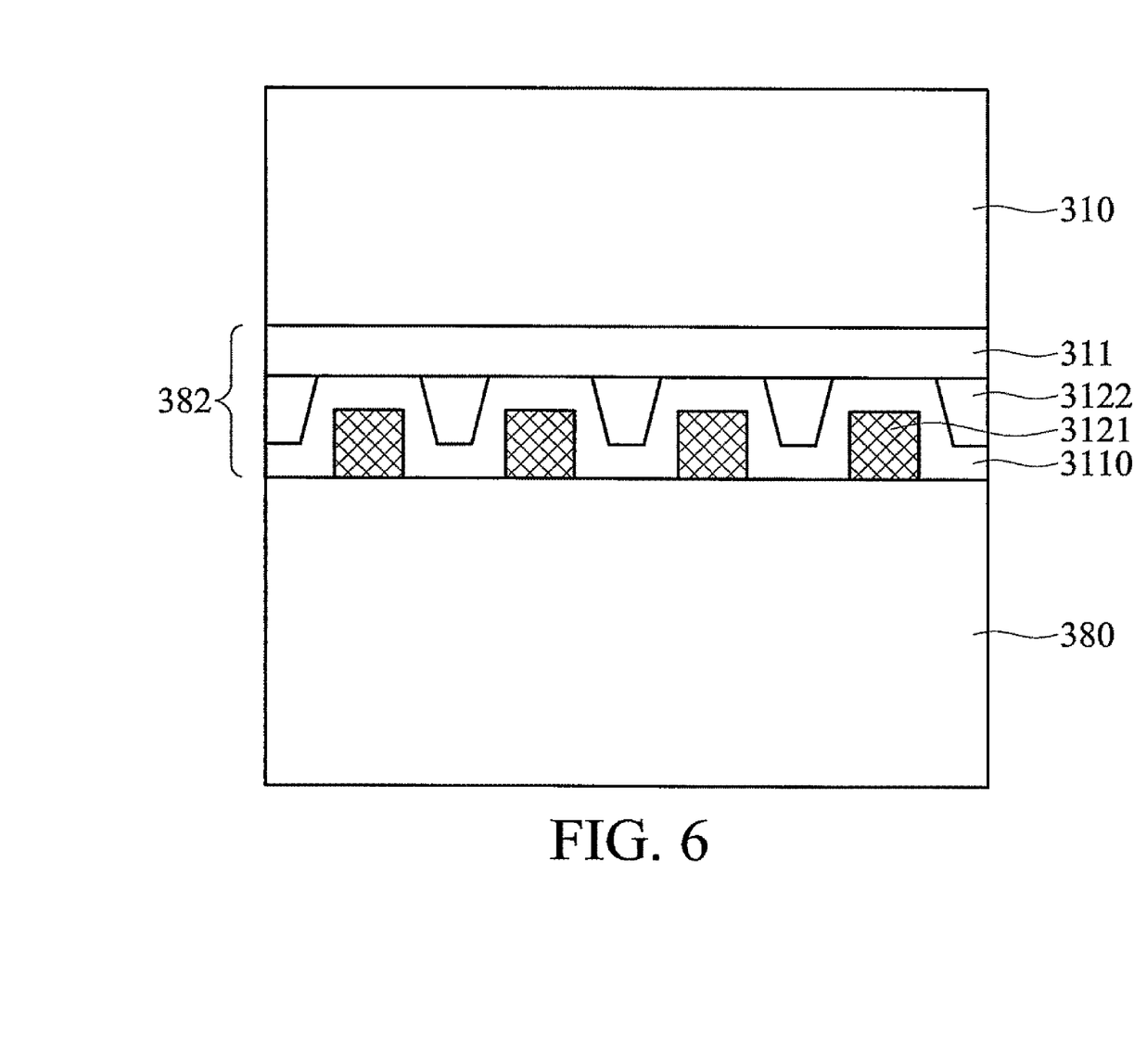

Each of FIGS. 1-3 substantially illustrates that a conductive substrate is a lower layer and a light-emitting stack layer is an upper layer while a stack structure is positioned therebetween to electrically connect them. The locations of the conductive substrate and the light-emitting stack layer are, nevertheless, exchangeable while the stack structure remains the same according to embodiments of the invention. FIG. 4, corresponding to FIG. 1, shows, from bottom to top, the light-emitting stack layer 180, optional reflection layer 13, the stack structure 182, and conductive substrate 10. FIG. 5, corresponding to FIG. 2, shows, from bottom to top, the light-emitting stack layer 280, the stack structure 282, and the conductive substrate 210. FIG. 6, corresponding to FIG. 3, shows, from bottom to top, the light-emitting stack layer 380, the stack structure 382, and the metal substrate 310.

In the above, the conductive substrate includes at least one material selected from a material group consisting of GaP, GaAsP, AlGaAs, Si, Ge, and SiC, or other substitute materials. The metal substrate includes at least one material selected from a material group consisting of Cu, Al, Mo, and MMC (metal matrix composite) carrier, or other substitute materials. The MMC carrier is a carrier with holes having been injected with a proper metal, so as to provide an adjustable heat conductive coefficient or a heat expansive coefficient. The adhesive material includes at least one material selected from a material group consisting of PI, BCB, and PFCB, or other substitute materials. The ohmic metal bulge includes at least one material selected from a material group consisting of In, Sn, Al, Au, Pt, Zn, Ge, Ag, Ti, Pb, Pd, Cu, AuBe, AuGe, Ni, PbSn, and AuZn, or other substitute materials. The reflection layer includes at least one material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide, or other substitute materials. The first reaction layer includes at least one material selected from a material group consisting of Ti and Cr, or other substitute materials. The second reaction layer includes at least one material selected from a material group consisting of Ti and Cr, or other substitute materials. The transparent conductive layer includes at least one material selected from a material group consisting of indium tin oxide, cadmium tin oxide, antimony tin oxide, zinc oxide, and zinc tin oxide, or other substitute materials. The first cladding layer includes at least one material selected from a material group consisting of AlGaInP, AlInP, AlN, GaN, AlGaN, InGaN, and AlInGaN, or other substitute materials. The light-emitting layer includes at least one material selected from a material group consisting of AlGaInP, GaN, InGaN, and AlInGaN, or other substitute materials. The second cladding layer includes at least one material selected from a material group consisting of AlGaInP, AlInP, AlN, GaN, AlGaN, InGaN, and AlInGaN, or other substitute materials. The second contact layer includes at least one material selected from a material group consisting of GaP, GaAs, GaAsP, InGaP, AlGaInP, AlGaAs, GaN, InGaN, and AlGaN, or other substitute materials. The first contact layer includes at least one material selected from a material group consisting of GaP, GaAs, GaAsP, InGaP, AlGaInP, AlGaAs, GaN, InGaN, and AlGaN, or other substitute materials.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An organic adhesive light-emitting device with ohmic metal contact comprising:
    a conductive substrate;
    a light-emitting stack layer, wherein one of the conductive substrate and the light-emitting stack layer is an upper layer and the other is a lower layer; and
    a stack structure positioned between the conductive substrate and the light-emitting stack layer for electrically connecting the conductive substrate to the light-emitting stack layer, the stack structure comprising:
        an ohmic metal layer formed over the lower layer and forming a protruding portion over the lower layer;
        a first reaction layer formed over the protruding portion;
        an organic adhesive material formed over the first reaction layer; and
        a second reaction layer formed over the organic adhesive material; wherein a part of the first reaction layer punches through the organic adhesive material to form an ohmic contact with the second reaction layer.

2. The organic adhesive light-emitting device with ohmic metal contact of claim 1 wherein the conductive substrate is a metal substrate.

3. The organic adhesive light-emitting device with ohmic metal contact of claim 1 wherein the upper layer is the light-emitting stack layer and the lower layer is the conductive substrate.

4. The organic adhesive light-emitting device with ohmic metal contact of claim 1 wherein the lower layer is the light-emitting stack layer and the upper layer is the conductive substrate.

5. The organic adhesive light-emitting device with ohmic metal contact of claim 1 further comprising a reflection layer between the stack structure and the light-emitting stack layer.

6. The organic adhesive light-emitting device with ohmic metal contact of claim 1 wherein the ohmic metal layer is formed with one or more metal bulges and the protruding portion is the one or more metal bulges.

7. The organic adhesive light-emitting device with ohmic metal contact of claim 1 wherein the ohmic metal layer is formed with a metal convex-concave surface.

8. The organic adhesive light-emitting device with ohmic metal contact of claim 1 wherein an ohmic contact is formed between the lower layer and the ohmic metal layer.

9. The organic adhesive light-emitting device with ohmic metal contact of claim 1 wherein an ohmic contact is formed between the second reaction layer and the upper layer.

10. An organic adhesive light-emitting device with ohmic metal contact comprising:
    a conductive substrate comprising an upper surface with a first region and a second region;
    an ohmic metal bulge formed over the first region of the conductive substrate;
    a first reaction layer formed over the second region and the ohmic metal bulge;
    an organic adhesive material formed over the first reaction layer;
    a second reaction layer formed over the organic adhesive material;
    wherein at least a part of the first reaction layer punches through the organic adhesive material to form an ohmic contact with the second reaction layer; and
    a light-emitting stack layer formed over the second reaction layer.

11. The organic adhesive light-emitting device with ohmic metal contact of claim 10 further comprising a reflection layer between the second reaction layer and the light-emitting stack layer.

12. The organic adhesive light-emitting device with ohmic metal contact of claim 11 wherein the reflection layer comprises a material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide.

13. The organic adhesive light-emitting device with ohmic metal contact of claim 10 wherein the conductive substrate comprises a material selected from a material group consisting of GaP, GaAsP, AloGaAs, Si, Ge, and SiC.

14. The organic adhesive light-emitting device with ohmic metal contact of claim 10 wherein the metal bulge comprises a material selected from a material group consisting of In, Sn, Al, Au, Pt, Zn, Ge, Ag, Ti, Pb, Pd, Cu, AuBe, AuGe, Ni, PbSn, and AuZn.

15. The organic adhesive light-emitting device with ohmic metal contact of claim 10 wherein the organic adhesive material comprises a material selected from a material group consisting of PI, BCB, and PFCB.

16. The organic adhesive light-emitting device with ohmic metal contact of claim 10 wherein the first reaction layer comprises a material selected from a material group consisting of Ti and Cr.

17. The organic adhesive light-emitting device with ohmic metal contact of claim 10 wherein the second reaction layer comprises a material selected from a material group consisting of Ti and Cr.

18. The organic adhesive light-emitting device with ohmic metal contact of claim 10 wherein the light-emitting stack layer comprises a material selected from a material group consisting of AlGaInP, GaN, InGaN, and AlInGaN.

19. The organic adhesive light-emitting device with ohmic metal contact of claim 10 wherein an ohmic contact is formed between the conductive substrate and the ohmic metal bulge.

20. The organic adhesive light-emitting device with ohmic metal contact of claim 10 wherein an ohmic contact is formed between the second reaction layer and the light-emitting stack layer.

21. The organic adhesive light-emitting device with ohmic metal contact of claim 10 wherein the light-emitting stack layer comprises:
    a transparent conductive layer;
    a first contact layer formed over the transparent conductive layer;
    a first cladding layer formed over the first contact layer;
    a light-emitting layer formed over the first cladding layer;
    a second cladding layer formed over the light-emitting layer; and
    a second contact layer formed over the second cladding layer.

22. An organic adhesive light-emitting device with ohmic metal contact comprising:
    a light-emitting stack layer comprising a upper surface with a first region and a second region;
    an ohmic metal bulge formed over the first region of the light-emitting stack layer;
    a second reaction layer formed over the second region and the ohmic metal bulge;
    an organic adhesive material formed over the second reaction layer;
    a first reaction layer formed over the organic adhesive material;
    wherein one part of the second reaction layer punches through the organic adhesive material to form an ohmic contact with the first reaction layer; and
    a conductive substrate formed over the first reaction layer.

23. The organic adhesive light-emitting device with ohmic metal contact of claim 22 further comprising a reflection layer between the ohmic metal bulge and the light-emitting stack layer.

24. The organic adhesive light-emitting device with ohmic metal contact of claim 23 wherein the reflection layer comprises a material selected from a material group consisting of In, Sn, Al, Au, Pt, Zn, Ge, Ag, Ti, Pb, Pd, Cu, AuBe, AuGe, Ni, Cr, PbSn, AuZn, and indium tin oxide.

25. The organic adhesive light-emitting device with ohmic metal contact of claim 22 wherein the conductive substrate comprises a material selected from a material group consisting of GaP, GaAsP, AlGaAs, Si, Ge, and SiC.

26. The organic adhesive light-emitting device with ohmic metal contact of claim 22 wherein the metal bulge comprises a material selected from a material group consisting of In, Sn, Al, Au, Pt, Zn, Ge, Ag, Ti, Pb, Pd, Cu, AuBe, AuGe, Ni, PbSn, and AuZn.

27. The organic adhesive light-emitting device with ohmic metal contact of claim 22 wherein the organic adhesive material comprises a material selected from a material group consisting of PI, BCB, and PFCB.

28. The organic adhesive light-emitting device with ohmic metal contact of claim 22 wherein the first reaction layer comprises a material selected from a material group consisting of Ti and Cr.

29. The organic adhesive light-emitting device with ohmic metal contact of claim 22 wherein the second reaction layer comprises a material selected from a material group consisting of Ti and Cr.

30. The organic adhesive light-emitting device with ohmic metal contact of claim 22 wherein the light-emitting stack layer comprises a material selected from a material group consisting of AlGaInP, gaN, InGaN, and AlLnGaN.

31. The organic adhesive light-emitting device with ohmic metal contact of claim 22 wherein an ohmic contact is formed between the first region of the light-emitting stack layer upper surface and the ohmic metal bulge.

32. The organic adhesive light-emitting device with ohmic metal contact of claim 22 wherein an ohmic contact is formed between the first reaction layer and the light-emitting stack layer.

33. The organic adhesive light-emitting device with ohmic metal contact of claim 22 wherein the light-emitting stack layer comprises:
    a transparent conductive layer;
    a first contact layer formed over the transparent conductive layer;
    a first cladding layer formed over the first contact layer;
    a light-emitting layer formed over the first cladding layer;
    a second cladding layer formed over the light-emitting layer; and
    a second contact layer formed over the second cladding layer.

34. An organic adhesive light-emitting device with ohmic metal contact comprising:
    a conductive substrate;
    an ohmic metal layer formed over the conductive substrate comprising a convex-concave surface;
    a first reaction layer formed over the convex-concave surface of the ohmic metal layer;
    an organic adhesive material formed over the first reaction layer;
    a second reaction layer formed over the organic adhesive material; wherein at least one part of the first reaction layer punches through the organic adhesive material to form an ohmic contact with the second reaction layer; and
    a light-emitting stack layer formed over the second reaction layer.

35. The organic adhesive light-emitting device with ohmic metal contact of claim 34 wherein the ohmic metal layer comprises a material selected from a material group consisting of In, Sn, Al, Au, Pt, Zn, Ge, Ag, Ti, Pb, Pd, Cu, AuBe, AuGe, Ni, PbSn, and AuZn.

36. An organic adhesive light-emitting device with ohmic metal contact comprising:
    a light-emitting stack layer;

an ohmic metal layer formed over the light-emitting stack layer comprising a convex-concave surface;

a second reaction layer formed over the convex-concave surface of the ohmic metal layer;

an organic adhesive material formed over the second reaction layer;

a first reaction layer formed over the organic adhesive material; wherein a part of the second reaction layer punches through the organic adhesive material to form an ohmic contact with the first reaction layer; and a conductive substrate formed over the first reaction layer.

37. The organic adhesive light-emitting device with ohmic metal contact of claim 36 wherein the ohmic metal layer comprises a material selected from a material group consisting of In, Sn, Al, Au, Pt, Zn, Ge, Ag, Ti, Pb, Pd, Cu, AuBe, AuGe, Ni, PbSn, and AuZn.

38. An organic adhesive light-emitting device with ohmic metal contact comprising:

a metal substrate comprising an upper surface with a first region and a second region;

an ohmic metal bulge formed over the first region of the metal substrate;

a first reaction layer formed over the ohmic metal bulge;

an organic adhesive material formed over the first reaction layer;

a second reaction layer formed over the organic adhesive material; wherein a part of the first reaction layer punches through the organic adhesive material to form an ohmic contact with the second reaction layer; and a light-emitting stack layer formed over the second reaction layer.

39. The organic adhesive light-emitting device with ohmic metal contact of claim 38 wherein the metal substrate comprises a material selected from a material group consisting of Cu, Al, Mo, and MMC carrier.

40. An organic adhesive light-emitting device with ohmic metal contact comprising:

a light-emitting stack layer comprising a upper surface with a first region and a second region;

an ohmic metal bulge formed over the first region of the light-emitting stack layer;

a second reaction layer formed over the ohmic metal bulge;

an organic adhesive material formed over the second reaction layer;

a first reaction layer formed over the organic adhesive material; wherein a part of the second reaction layer punches through the organic adhesive material to form an ohmic contact with the first reaction layer; and a metal substrate formed over the first reaction layer.

41. The organic adhesive light-emitting device with ohmic metal contact of claim 40 wherein the metal substrate comprises at least one material selected from a material group consisting of Cu, Al, Mo, and MMC carrier.

\* \* \* \* \*